(12) United States Patent
Yang et al.

(10) Patent No.: US 12,525,551 B2
(45) Date of Patent: Jan. 13, 2026

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Chung-Chieh Yang, Zhubei (TW); Yung-Chow Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 720 days.

(21) Appl. No.: 17/834,625

(22) Filed: Jun. 7, 2022

(65) Prior Publication Data

US 2023/0275043 A1   Aug. 31, 2023

Related U.S. Application Data

(60) Provisional application No. 63/314,349, filed on Feb. 25, 2022.

(51) Int. Cl.
*H01L 23/522* (2006.01)
*H01L 23/528* (2006.01)
(Continued)

(52) U.S. Cl.
CPC ........ *H01L 23/642* (2013.01); *H01L 23/5223* (2013.01); *H10D 1/042* (2025.01); *H10D 1/716* (2025.01)

(58) Field of Classification Search
CPC ............... H01L 23/642; H01L 23/5223; H01L 23/5283; H01L 23/5386; H10D 1/042;
(Continued)

(56) References Cited

U.S. PATENT DOCUMENTS

2007/0187739 A1* 8/2007 Liu ..................... H01L 23/5223
257/306
2010/0123213 A1* 5/2010 Chen ..................... H10D 1/716
257/532

(Continued)

FOREIGN PATENT DOCUMENTS

TW   200746387 A   12/2007

OTHER PUBLICATIONS

Office Action issued in connection with Taiwan Appl. No. 11320093510 dated Jan. 26, 2024.

*Primary Examiner* — Omar F Mojaddedi
(74) *Attorney, Agent, or Firm* — FOLEY & LARDNER LLP

(57) ABSTRACT

A semiconductor device includes a capacitor having a first conductor plate, a second conductor plate, and a portion of a dielectric layer interposed therebetween. The semiconductor device includes a plurality of first contact structures in electrical contact with the first conductor plate. The semiconductor device includes a plurality of second contact structures in electrical contact with the second conductor plate. The plurality of first contact structures and the plurality of second contact structures are laterally arranged in a checkboard pattern, thereby causing each of the plurality of first contact structures to be surrounded by respective four of the plurality of second contact structures.

20 Claims, 20 Drawing Sheets

(51) Int. Cl.
  *H01L 23/538* (2006.01)
  *H01L 23/64* (2006.01)
  *H10D 1/00* (2025.01)
  *H10D 1/68* (2025.01)
  *H10D 89/10* (2025.01)

(58) Field of Classification Search
  CPC .......... H10D 1/716; H10D 1/692; H10D 1/68;
  H10D 84/811; H10D 89/10
  See application file for complete search history.

(56) References Cited

U.S. PATENT DOCUMENTS

2020/0066834 A1* 2/2020 Rubin ............... H01L 21/76877
2020/0279805 A1* 9/2020 Manipatruni ..... H01L 21/76885
2021/0351750 A1* 11/2021 Kim ........................ H01L 23/66

* cited by examiner

SEMICONDUCTOR DEVICES AND METHODS OF MANUFACTURING THEREOF

CROSS-REFERENCE TO RELATED APPLICATION

This application claims priority to and the benefit of U.S. Provisional Application No. 63/314,349, filed Feb. 25, 2022, entitled "METAL-INSULATOR-METAL (MIM) CAPACITORS WITH INTERLEAVED CONTACTS," which is incorporated herein by reference in its entirety for all purposes.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
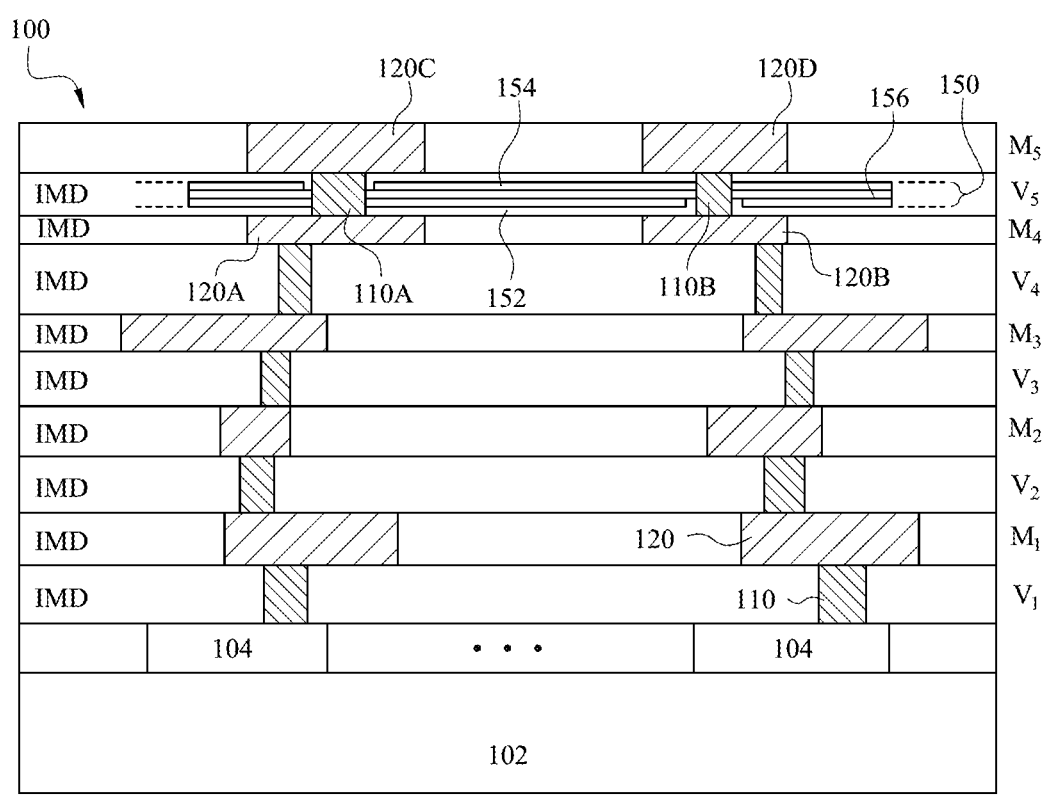
FIG. 1 illustrate a cross-sectional view of a semiconductor device including an MIM capacitor, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Metal-insulator-metal (MIM) capacitors are used in many applications on an integrated circuit (IC), including for signal/power conditioning. During the operation of certain circuits, power supply lines (sometimes referred to as power rails) may supply transient currents with a relatively high intensity. These conditions can result in noise on the power supply lines. Specifically, the voltage on the power supply line may fluctuate when the transition time of the transient current is particularly short or when the line's parasitic inductance or parasitic resistance is large. To ameliorate such conditions, filtering or decoupling capacitors (in the form of MIM capacitors) may be used, acting as temporary charge reservoirs to prevent momentary fluctuations in supply voltage.

In general, the MIM capacitors are integrated in multilevel interconnect structures at different levels. For example, the top plate/electrode and bottom plate/electrode of an MIM capacitor are electrically coupled to a respective group of interconnect structures at two different metallization levels/layers. A number of first contacts (e.g., via structures) and a number of second contacts (e.g., via structures) can be used to electrically couple the top plate and bottom plate to their respective group of interconnect structures, which may, for example, carry power or signal to be conditioned.

The existing contacts formed for an MIM capacitor may entail a number of issues. For example, a capacitive density and capacitive bandwidth of the existing MIM capacitor may be limited by arrangements of the existing contacts. The first contacts, which are typically connected to a first polarity, are each surrounded by at most two of the second contacts, which are typically connected to a second polarity. As such, the value of an equivalent series resistance (ESR) of the MIM capacitor's plate resistance can be significantly large, which can boost an RC constant of the MIM capacitor. As such, operation speed of the MIM capacitor is disadvantageously dragged. Thus, the existing contacts formed for an MIM capacitor have not been entirely satisfactory in many aspects.

The present disclosure provides various embodiments of contact structures formed for an MIM capacitor. For example, the contact structures are arranged such that a first group of the contact structures, connected to a first polarity, are each surrounded by four of a second group of the contact structures, connected to a second polarity. In other words, within a shortest distance from each of the first group of contact structures (e.g., along a horizontal/vertical direction), the next neighboring contact structures all belong to the second group of contact structures. As a result, the first group of contact structures and the second group of contact structures can form a checkboard pattern. In this way, the ESR of a corresponding MIM capacitor's plate resistance can be significantly reduced, which, for example, can cause a capacitive density and capacitive bandwidth of the corresponding MIM capacitor to increase about 1.2 times and about 1.6 times, respectively. Further, with such a checkboard arrangement of the first and second groups of contact structures, the corresponding coupled interconnect structures can be formed in various patterns. For example, the interconnect structures may each be formed to tilt away from a horizontal/vertical direction. In another example, the interconnect structures may each be formed to have a first portion extending along a horizontal/vertical direction and further include a number of second portions protruding out from the corresponding first portion.

Referring to FIG. 1, depicted is a cross-sectional view of an example semiconductor device (or an integrated circuit) 100 that includes at least one MIM capacitor 150, in accordance with various embodiments. The semiconductor device 100 may be implemented as any of various circuits, e.g., a system-on-chip (SoC) circuit. Such a circuit can include a number of areas, for example, a logic area, a memory area, a decoupling capacitor area, etc., any of which can be configured to form the MIM capacitor 150. The cross-sectional view of FIG. 1 is simplified, and thus, it should be understood that the semiconductor device 100 can include any of various other components while remaining within the scope of the present disclosure.

As shown, the semiconductor device 100 includes a substrate 102, a number of device structures (e.g., transistors) 104 formed over the substrate 102, and a number of metallization layers over the device structures 104. For example in FIG. 1, the semiconductor device 100 includes a number of metallization layers M1, M2, M3, M4, and M5, and each of the metallization layers M1 to M5 includes a number of conductor structures 120 (e.g., formed as metal lines, metal traces, or otherwise metal routes). The semiconductor device 100 further includes a number of via layers, V1, V2, V3, V4, and V5, and each of the via layers V1 to V5 includes a number of contact structures 110 (e.g., formed as via structures) interposed between the device structures 104 and the bottommost metallization layer or between neighboring ones of the metallization layers. The contact structure 110 can electrically couple the device structure 104 or the conductor structure 120 of one of the metallization layer to the conductor structure 120 of another one of the metallization layers. Also, each of the metallization layers and the via layers includes an inter-metal dielectric (IMD) material embedding the corresponding conductor structures 120 or the corresponding via structures 110. In some embodiments, V1 may be referred to as a part of M1, V2 may be referred to as a part of M2, V3 may be referred to as a part of M3, and so on.

In various embodiments, the MIM capacitor 150 is interposed between two of the metallization layers. For example in FIG. 1, the MIM capacitor 150 interposed between the metallization layer M4 and the metallization layer M5. The MIM capacitor 150 includes a first (e.g., bottom) conductor plate 152 and a second (e.g., top) conductor plate 154, which function as a first electrode and a second electrode of the capacitor, respectively. The first and second conductor plates, 152 and 154, may each include any of a variety of metal materials such as, for example, Pt, AlCu, TiN, Au, Ti, Ta, TaN, W, WN, Cu, metal nitrides, and silicided metal nitrides. In some embodiments, a dielectric layer 156 (e.g., different from the IMD material) interposed between the vertically separated first and second conductor plates, 152 and 154, may function as a dielectric medium of the MIM capacitor 150. Such an additional dielectric layer may be formed from an insulating material, including but not limited to, NiO, TiO, HfO, ZrO, ZnO, $WO_3$, $Al_2O_3$, TaO, MoO, and CuO. The insulating material may be a high dielectric constant (high-k) material, which may include $TiO_2$, $Ta_2O_5$, $Y_2O_3$, $La_2O_5$, $HfO_2$, and other materials. In some other embodiments, a portion of the IMD material of the V5 layer interposed between the vertically separated first and second conductor plates, 152 and 154, may function as a dielectric medium of the MIM capacitor 150.

In various embodiments, the first and second conductor plates, 152 and 154, may each be spaced from the conductor structures 120 of the neighboring metallization layers. For example, the conductor plate 152 is spaced from the conductor structures 120 of the metallization layer M4 with a portion of the IMD in the V5 layer, and the conductor plate 152 is spaced from the conductor structures 120 of the metallization layer M5 with another portion of the IMD in the V5 layer. However, the first conductor plate 152 is in electrical contact with a number of conductor structures 120 in the (lower) metallization layer M4 (e.g., 120A) through a number of contact structures, e.g., 110A, and the second conductor plate 154 is in electrical contact with a number of conductor structures 120 in the (upper) metallization layer M5 (e.g., 120D) through a number of contact structures, e.g., 110B. Further, as shown in FIG. 1, the contact structure 110A, spaced (e.g., electrically isolated) from the second conductor plate 154, can be in contact with one of the conductor structures 120 in the metallization layer M5 (e.g., 120C), and the contact structure 110B, spaced (e.g., electrically isolated) from the first conductor plate 152, can be in contact with one of the conductor structures 120 in the metallization layer M4 (e.g., 120B).

In various embodiments, one of the conductor plates 152 and 154 is electrically connected to corresponding conductor structures that have a first polarity, and the other of the conductor plates 152 and 154 is electrically connected to corresponding conductor structures that have a second polarity. For example, the conductor plate 152 is connected to the conductor structures 120A and 120C that carry a first polarity of supply voltage (e.g., VSS), while the conductor plate 154 is connected to the conductor structures 120B and 120D that carry a second polarity of supply voltage (e.g., VDD). Accordingly, the corresponding contact structure 110A connected to the conductor plate 152 may have the first polarity, and the corresponding contact structure 110B connected to the conductor plate 154 may have the second polarity. Hereinafter, the contact structures 110A and 110B may sometimes be referred to as "a contact structure with first polarity" and "a contact structure with second polarity," respectively, and their corresponding connected conductor structures 120 may sometimes be referred to as "conductor structures with first polarity" and "conductor structures with second polarity," respectively.

Figure 2:
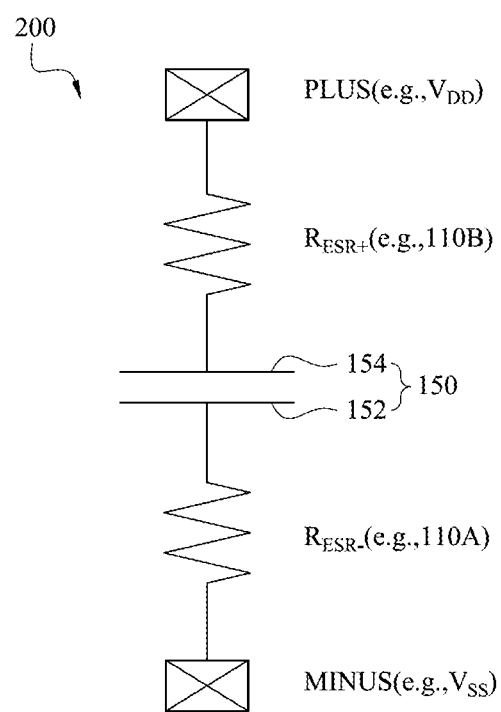
FIG. 2 illustrates an equivalent circuit of the MIM capacitor of FIG. 1, in accordance with some embodiments.

FIG. 2 illustrates an equivalent circuit diagram of the MIM capacitor 150 connected between a plus terminal (representing the conductor structures 120 carrying VDD) and a minus terminal (representing the conductor structures 120 carrying VSS). The conductor plate 152 is connected to the minus terminal, and the conductor plate 154 is connected to the plus terminal. The contact structure(s) 110A connecting the first conductor plate 152 to the minus terminal (e.g., the contact structures with first polarity) may be represented by an equivalent series resistor $R_{ESR-}$, and the contact structure(s) 110B connecting the second conductor plate 154 to the plus terminal (e.g., the contact structures with second polarity) may be represented by an equivalent series resistor $R_{ESR+}$. In various embodiments, the contact structures with first polarity and the contact structures with second polarity may be arranged with each other in a checkboard pattern, which can significantly lower the values of $R_{ESR-}$ and $R_{ESR+}$. Consequently, an RC constant of the MIM capacitor 150 can be extensively suppressed, which can advantageously boost performance (e.g., bandwidth) of the MIM capacitor 150. Various embodiments of such a checkboard arrangement will be discussed as follows.

Figure 3:
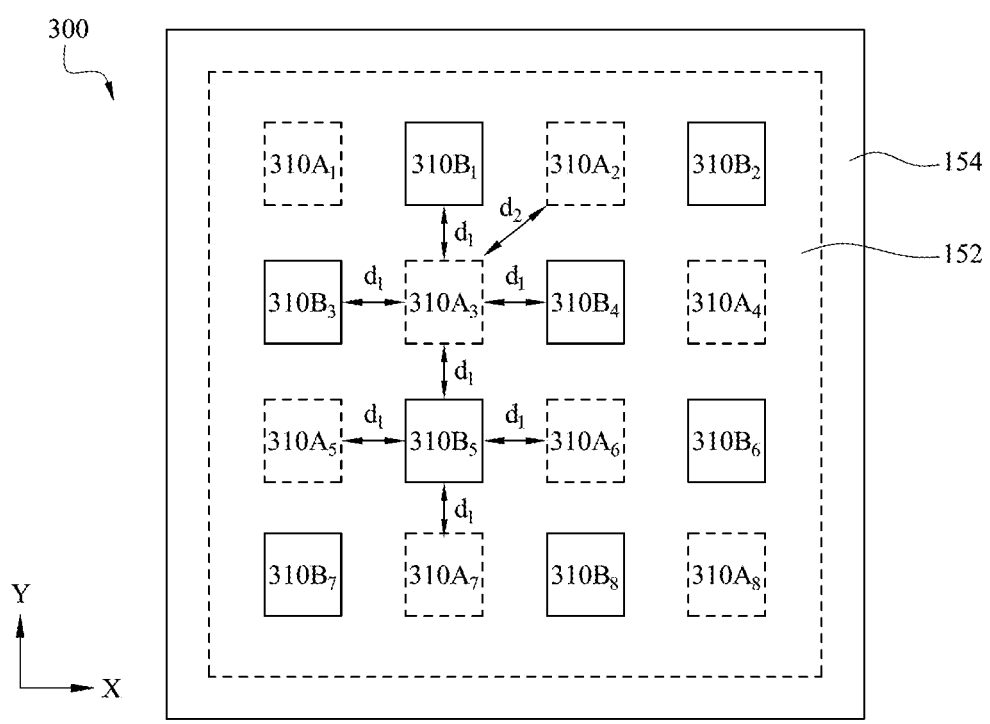
FIGS. 3, 4, and 5 each illustrate an example layout of first contact structures and second contact structures of the MIM capacitor of FIG. 1, in accordance with some embodiments.

FIG. 3 illustrates an example layout (or arrangement) 300 of the MIM capacitor 150 including a number contact structures with first polarity (e.g., 310A$_1$, 310A$_2$, 310A$_3$, 310A$_4$, 310A$_5$, 310A$_6$, 310A$_7$, and 310A$_8$) and a number of contact structures with second polarity (e.g., 310B$_1$, 310B$_2$, 310B$_3$, 310B$_4$, 310B$_5$, 310B$_6$, 310B$_7$, and 310B$_8$), in accordance with various embodiments. Although there are eight contact structures for each polarity in the layout 300, it should be appreciated that the MIM capacitor 150 can be connected to any number of contact structures with the first polarity and/or second polarity while remaining within the scope of the present disclosure. The layout 300 is a top or plain view of at least a portion of the MIM capacitor 150, with the conductor plate 152 disposed beneath (or overlapped with) the conductor plate 154. Further, the contact structures with first polarity, 310A$_1$ to 310A$_8$, and the contact structures with second polarity, 310B$_1$ to 310B$_8$, are laterally disposed within the overlapped area between the conductor plates 152 and 154, as shown in FIG. 3.

The contact structures with first polarity, 310A$_1$ to 310A$_8$, and the contact structures with second polarity, 310B$_1$ to 310B$_8$, are arranged within such an overlapped area as an array, that is, a number of rows along a first lateral direction (e.g., the X direction/axis) intersecting a number of columns along a second lateral direction (e.g., the Y direction/axis). The array can be formed as a checkboard pattern, in accordance with various embodiments. Specifically, along the X direction, a subgroup of the contact structures with first polarity are alternately arranged with a corresponding subgroup of the contact structures with second polarity. Similarly, along the Y direction, a subgroup of the contact structures with first polarity are alternately arranged with a corresponding subgroup of the contact structures with second polarity.

For example, along the X direction on a 1$^{st}$ row of the array, the contact structures of first polarity, 310A$_1$ and 310A$_2$, and the contact structures of second polarity, 310B$_1$ and 310B$_2$, are alternately arranged with each other. In another example, along the Y direction on a 1$^{st}$ column of the array, the contact structures of first polarity, 310A$_1$ and 310A$_5$, and the contact structures of second polarity, 310B$_3$ and 310B$_7$, are alternately arranged with each other.

By arranging the contact structures with different polarities in such a checkboard pattern, the next neighboring contact structure that each of the contact structures with first polarity (except for the ones along an edge of the array) meets is a contact stricture with second opposite polarity, and vice versa. In other words, within a shortest separation distance from any of the contact structures with first polarity, there is at least one contact structure with second polarity.

Further, each contact structure with a polarity (except for the edge ones) can meet (or be surrounded by) four contact structures with a different polarity within the shortest separation distance. Such a distance can be characterized with "$d_1$," which may sometimes be referred to as the shortest distance along either the X or Y direction between any adjacent contact structures (e.g., regardless of the polarity). For example in FIG. 3, the contact structure with first polarity, 310A$_3$, is surrounded by four contact structure with second polarity, 310B$_1$, 310B$_3$, 310B$_4$, and 310B$_5$, within the distance $d_1$. In another example, the contact structure with second polarity, 310B$_5$, is surrounded by four contact structure with first polarity, 310A$_3$, 310A$_5$, 310A$_6$, and 310A$_7$, within the distance $d_1$.

Still further, each contact structure with a polarity (except for the edge ones) can meet (or be surrounded by) four contact structures with the same polarity within another separation distance that is determined based on the distance di. Such a distance can be characterized with "$d_2$," which may sometimes be referred to as the shortest distance along a direction tilted from the X or Y direction between any adjacent contact structures with the same polarity. In some embodiments, the distance $d_2$ may be approximately equal to a square root of two times the distance $d_1$, i.e., $d_2=\sqrt{d_1^2+d_1^2}$. For example, the contact structure with first polarity, 310A$_3$, is surrounded by four contact structure with first polarity, 310A$_1$, 310A$_2$, 310A$_5$, and 310A$_6$, within the distance $d_2$. In another example, the contact structure with second polarity, 310B$_5$, is surrounded by four contact structure with second polarity, 310B$_3$, 310B$_4$, 310B$_7$, and 310B$_8$, within the distance $d_2$.

Figure 4:
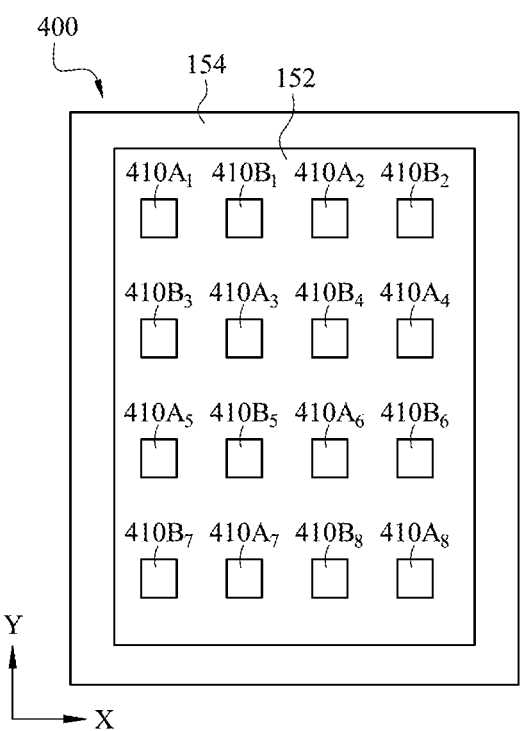

FIG. 4 illustrates an example layout (or arrangement) 400 of the MIM capacitor 150 including a number contact structures with first polarity (e.g., 410A$_1$, 410A$_2$, 410A$_3$, 410A$_4$, 410A$_5$, 410A$_6$, 410A$_7$, and 410A$_8$) and a number of contact structures with second polarity (e.g., 410B$_1$, 410B$_2$, 410B$_3$, 410B$_4$, 410B$_5$, 410B$_6$, 410B$_7$, and 410B$_8$), in accordance with various embodiments. The layout 400 is substantially similar to the layout 300 of FIG. 3 except that, in the layout 400, the conductor plates 152 and 154 are formed in a rectangular shape with their long sides extending along the Y direction and short sides extending along the X direction. The contact structures with first polarity, 410A$_1$ to 410A$_8$, and the contact structures with second polarity, 410B$_1$ to 410B$_8$, are still arranged to form a checkboard pattern within an overlapped area formed by the conductor plates 152 and 154, and thus, the corresponding description will not be repeated.

Figure 5:
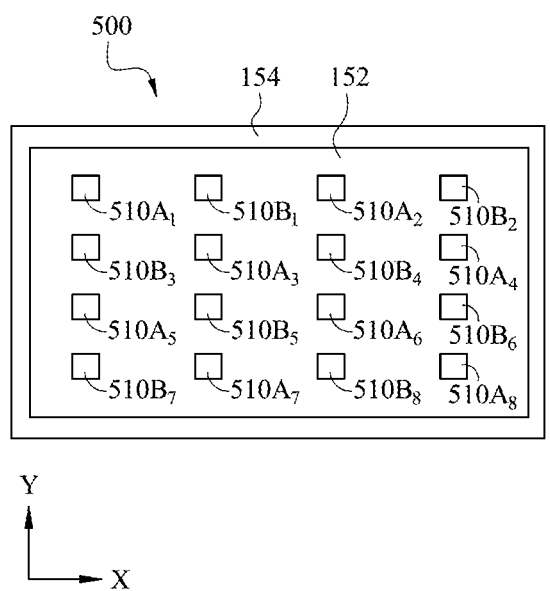

FIG. 5 illustrates an example layout (or arrangement) 500 of the MIM capacitor 150 including a number contact structures with first polarity (e.g., 510A$_1$, 510A$_2$, 510A$_3$, 510A$_4$, 510A$_5$, 510A$_6$, 510A$_7$, and 510A$_8$) and a number of contact structures with second polarity (e.g., 510B$_1$, 510B$_2$, 510B$_3$, 510B$_4$, 510B$_5$, 510B$_6$, 510B$_7$, and 510B$_8$), in accordance with various embodiments. The layout 500 is substantially similar to the layout 300 of FIG. 3 except that, in the layout 500, the conductor plates 152 and 154 are formed in a rectangular shape with their short sides extending along the Y direction and long sides extending along the X direction. The contact structures with first polarity, 510A$_1$ to 510A$_8$, and the contact structures with second polarity, 510B$_1$ to 510B$_8$, are still arranged to form a checkboard pattern within an overlapped area formed by the conductor plates 152 and 154, and thus, the corresponding description will not be repeated.

With the contact structures for the MIM capacitor 150 formed in such a checkboard pattern (e.g., layout 300, 400, or 500), the corresponding conductor structures with first polarity and conductor structures with second polarity may be arranged in various patterns accordingly. As discussed above, the conductor structures with first polarity and the conductor structures with second polarity may be disposed in the same metallization layer or respectively different metallization layers.

These various patterns will be discussed in layouts (further including conductor structures in one or more metallization layers) 600, 700, 800, 900, 1000, 1100, 1200, 1300, 1400, 1500, 1600, and 1700 of FIGS. 6, 7, 8, 9, 10, 11, 12, 13, 14, 15, 16, and 17, respectively. For example, the layouts (of the MIM capacitor including conductor structures) 600, 700, 1200, 1300, 1400, 1500, 1600, and 1700 are provided based on the layout (having contact structures) 300; the layouts (of the MIM capacitor including conductor structures) 800 and 900 are provided based on the layout (having contact structures) 500; and the layouts (of the MIM capacitor including conductor structures) 1000 and 1100 are provided based on the layout (having contact structures) 400. Further, for the sake of clarity, the contact structures with first polarity ($310A_1$ to $310A_8$, $410A_1$ to $410A_8$, $510A_1$ to $510A_8$) will be collectively labeled as letter "A," and the contact structures with second polarity ($310B_1$ to $310B_8$, $410B_1$ to $410B_8$, $510B_1$ to $510B_8$) will be collectively labeled as letter "B" in the following discussion of FIGS. 6-17.

Figure 6:
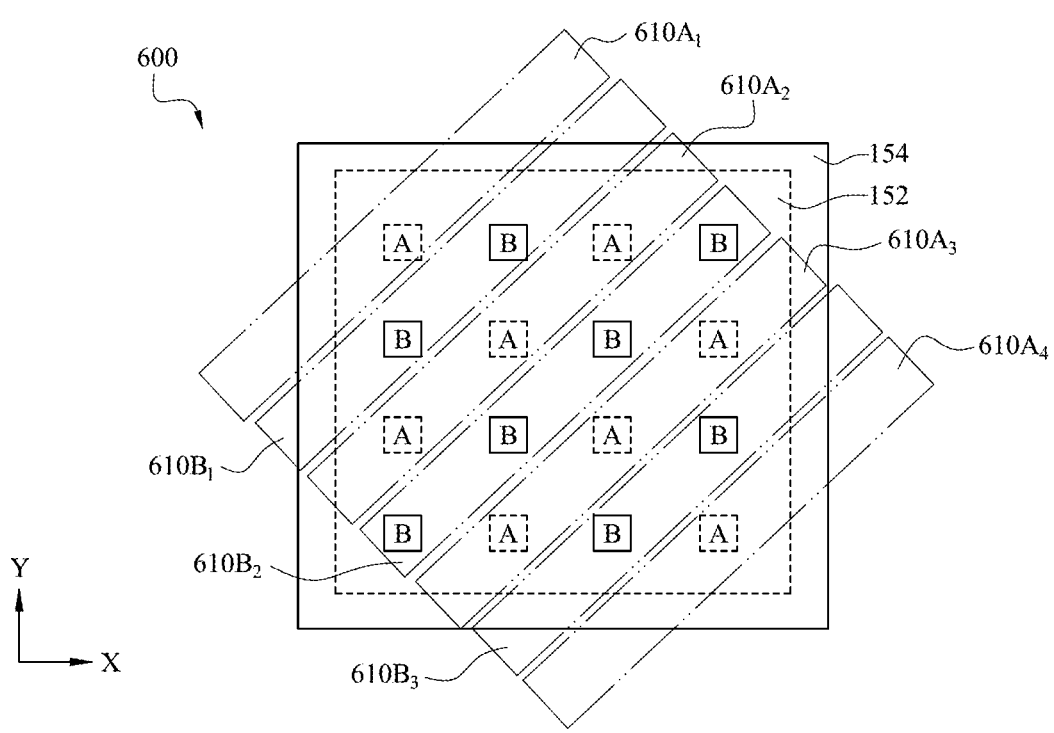
FIGS. 6, 7, 8, 9, 10, 11, 12, 13, 14, 15, 16, and 17 each illustrate an example layout of first conductor structures and second conductor structures of the MIM capacitor of FIG. 1, in accordance with some embodiments.

Referring first to FIG. 6, the layout 600 includes first conductor structures $610A_1$, $610A_2$, $610A_3$, and $610A_4$ connected to the contact structures with first polarity (A) formed based on the layout 300, and second conductor structures $610B_1$, $610B_2$, and $610B_3$ connected to the contact structures with second polarity (B) formed based on the layout 300. Specifically, each of the first conductor structures $610A_1$ to $610A_4$ extends along a direction tilted from the X or Y direction with an angle (e.g., about 45 or 135 degrees) to contact one or more of the contact structures with first polarity (A), and each of the second conductor structures $610B_1$ to $610B_3$ extends along the same direction tilted from the X or Y direction with the same angle (e.g., about 45 or 135 degrees) to contact one or more of the contact structures with second polarity (B). As such, the first and second conductor structures, $610A_1$ to $610A_4$ and $610B_1$ to $610B_3$, may be parallel with one another. In various embodiments, the first conductor structures $610A_1$ to $610A_4$ and the second conductor structures $610B_1$ to $610B_3$ may be disposed in different metallization layers, respectively, or in the same metallization layer. In some embodiments, the first conductor structures $610A_1$ to $610A_4$ may be configured to carry a first supply voltage (e.g., VDD), while the second conductor structures $610B_1$ to $610B_3$ may be configured to carry a second supply voltage (e.g., VSS).

Figure 7:
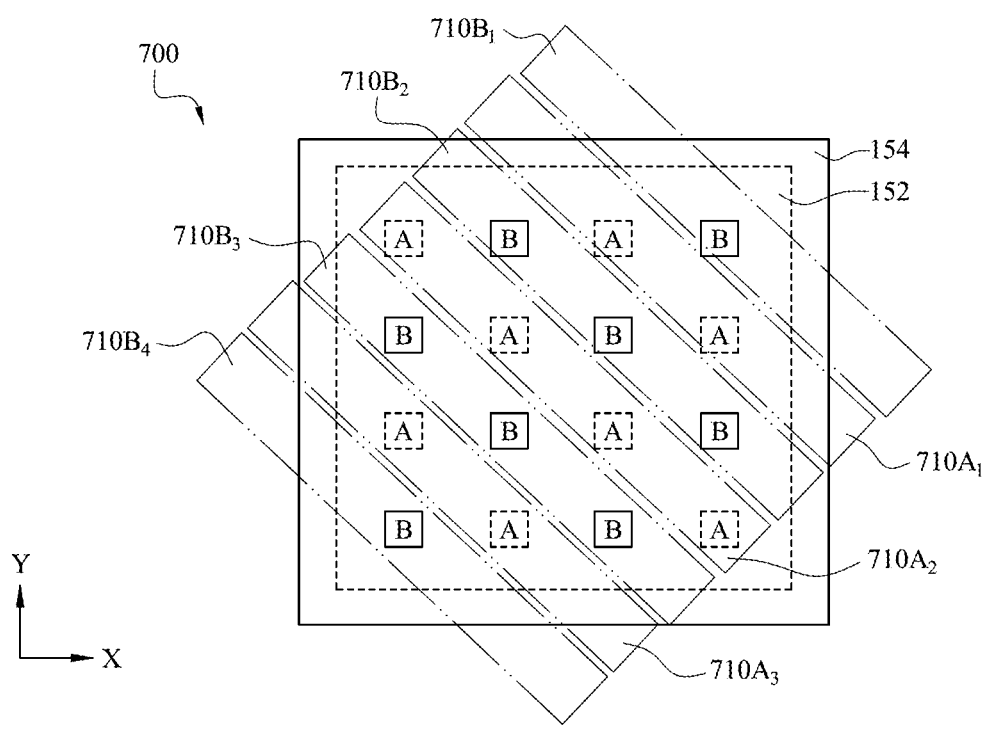

Referring next to FIG. 7, the layout 700 includes first conductor structures $710A_1$, $710A_2$, and $710A_3$, connected to the contact structures with first polarity (A) formed based on the layout 300, and second conductor structures $710B_1$, $710B_2$, $710B_3$, and $710B_4$ connected to the contact structures with second polarity (B) formed based on the layout 300. Specifically, each of the first conductor structures $710A_1$ to $710A_3$ extends along a direction tilted from the X or Y direction with an angle (e.g., about 45 or 135 degrees) to contact one or more of the contact structures with first polarity (A), and each of the second conductor structures $710B_1$ to $710B_4$ extends along the same direction tilted from the X or Y direction with the same angle (e.g., about 45 or 135 degrees) to contact one or more of the contact structures with second polarity (B). As such, the first and second conductor structures, $710A_1$ to $710A_3$ and $710B_1$ to $710B_4$, may be parallel with one another. In various embodiments, the first conductor structures $710A_1$ to $710A_3$ and the second conductor structures $710B_1$ to $710B_4$ may be disposed in different metallization layers, respectively, or in the same metallization layer. In some embodiments, the first conductor structures $710A_1$ to $710A_3$ may be configured to carry a first supply voltage (e.g., VDD), while the second conductor structures $710B_1$ to $710B_4$ may be configured to carry a second supply voltage (e.g., VSS).

Figure 8:
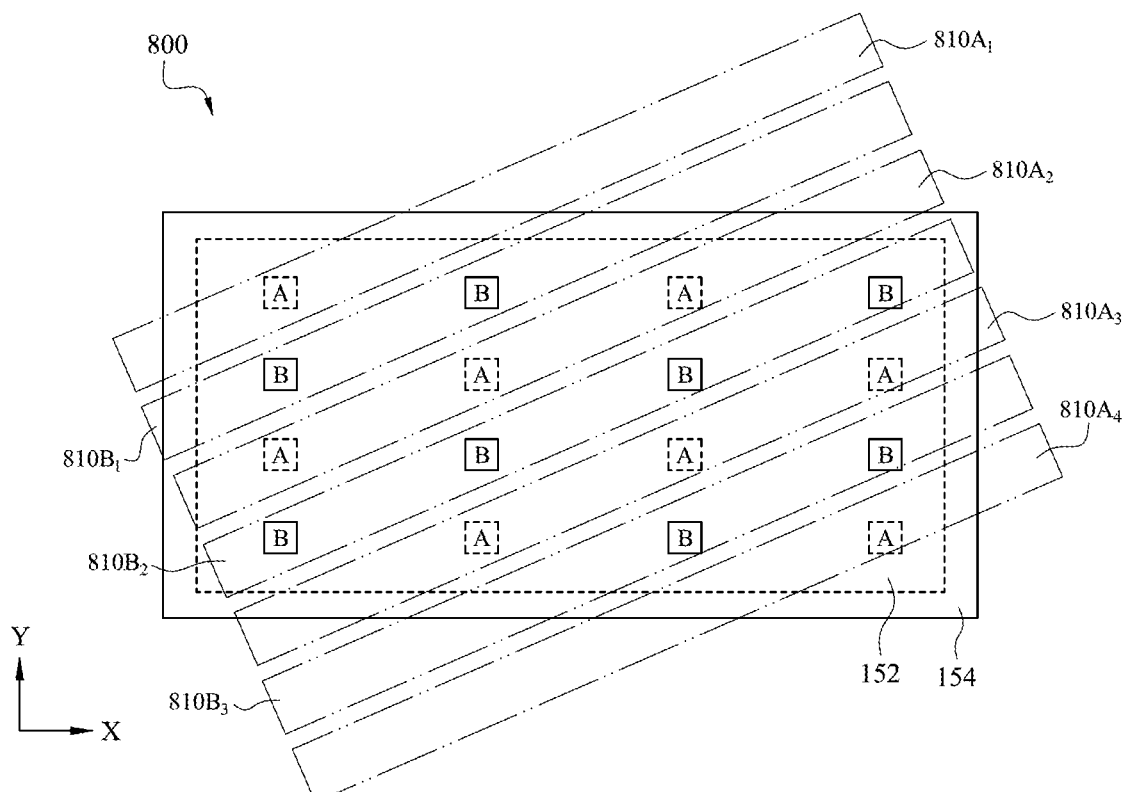

Referring next to FIG. 8, the layout 800 includes first conductor structures $810A_1$, $810A_2$, $810A_3$, and $810A_4$ connected to the contact structures with first polarity (A) formed based on the layout 500, and second conductor structures $810B_1$, $810B_2$, and $810B_3$ connected to the contact structures with second polarity (B) formed based on the layout 500. Specifically, each of the first conductor structures $810A_1$ to $810A_4$ extends along a direction tilted from the X or Y direction with an angle (e.g., about 15 or 165 degrees) to contact one or more of the contact structures with first polarity (A), and each of the second conductor structures $810B_1$ to $810B_3$ extends along the same direction tilted from the X or Y direction with the same angle (e.g., about 15 or 165 degrees) to contact one or more of the contact structures with second polarity (B). As such, the first and second conductor structures, $810A_1$ to $810A_4$ and $810B_1$ to $810B_3$, may be parallel with one another. In various embodiments, the first conductor structures $810A_1$ to $810A_4$ and the second conductor structures $810B_1$ to $810B_3$ may be disposed in different metallization layers, respectively, or in the same metallization layer. In some embodiments, the first conductor structures $810A_1$ to $810A_4$ may be configured to carry a first supply voltage (e.g., VDD), while the second conductor structures $810B_1$ to $810B_3$ may be configured to carry a second supply voltage (e.g., VSS).

Figure 9:
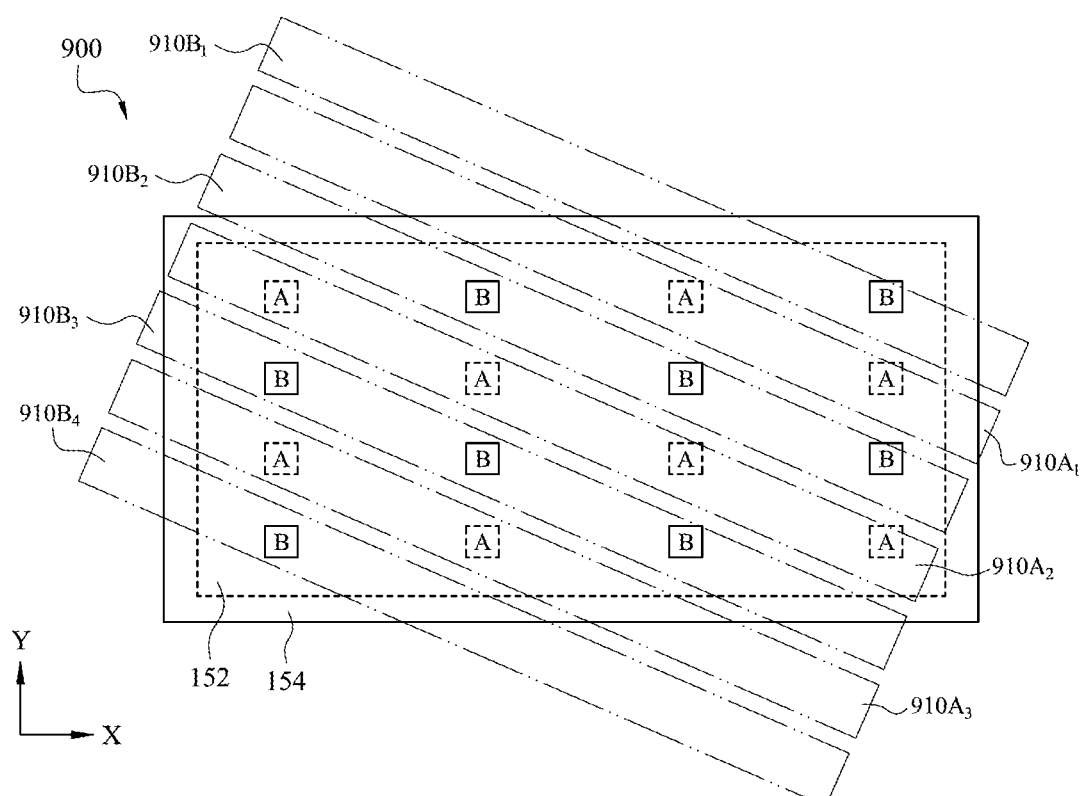

Referring next to FIG. 9, the layout 900 includes first conductor structures $910A_1$, $910A_2$, and $910A_3$, connected to the contact structures with first polarity (A) formed based on the layout 500, and second conductor structures $910B_1$, $910B_2$, $910B_3$, and $910B_4$ connected to the contact structures with second polarity (B) formed based on the layout 500. Specifically, each of the first conductor structures $910A_1$ to $910A_3$ extends along a direction tilted from the X or Y direction with an angle (e.g., about 15 or 165 degrees) to contact one or more of the contact structures with first polarity (A), and each of the second conductor structures $910B_1$ to $910B_4$ extends along the same direction tilted from the X or Y direction with the same angle (e.g., about 15 or 165 degrees) to contact one or more of the contact structures with second polarity (B). As such, the first and second conductor structures, $910A_1$ to $910A_3$ and $910B_1$ to $910B_4$, may be parallel with one another. In various embodiments, the first conductor structures $910A_1$ to $910A_3$ and the second conductor structures $910B_1$ to $910B_4$ may be disposed in different metallization layers, respectively, or in the same metallization layer. In some embodiments, the first conductor structures $910A_1$ to $910A_3$ may be configured to carry a first supply voltage (e.g., VDD), while the second conductor structures $910B_1$ to $910B_4$ may be configured to carry a second supply voltage (e.g., VSS).

Figure 10:
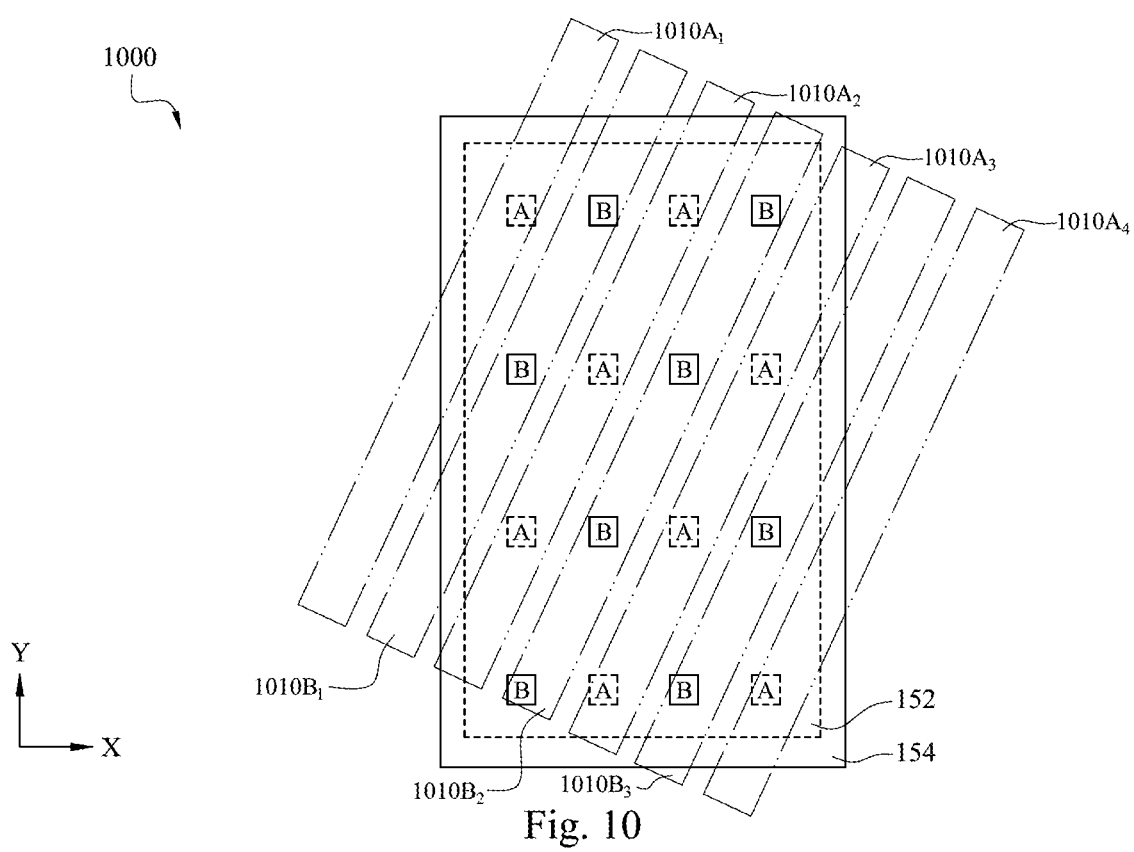

Referring next to FIG. 10, the layout 1000 includes first conductor structures $1010A_1$, $1010A_2$, $1010A_3$, and $1010A_4$ connected to the contact structures with first polarity (A) formed based on the layout 400, and second conductor structures $1010B_1$, $1010B_2$, and $1010B_3$ connected to the contact structures with second polarity (B) formed based on the layout 400. Specifically, each of the first conductor structures $1010A_1$ to $1010A_4$ extends along a direction tilted from the X or Y direction with an angle (e.g., about 75 or 105 degrees) to contact one or more of the contact structures with first polarity (A), and each of the second conductor structures $1010B_1$ to $1010B_3$ extends along the same direction tilted from the X or Y direction with the same angle (e.g., about 75 or 105 degrees) to contact one or more of the contact structures with second polarity (B). As such, the first and second conductor structures, $1010A_1$ to $1010A_4$ and $1010B_1$ to $1010B_3$, may be parallel with one another. In various embodiments, the first conductor structures $1010A_1$ to $1010A_4$ and the second conductor structures $1010B_1$ to $1010B_3$ may be disposed in different metallization layers, respectively, or in the same metallization layer. In some embodiments, the first conductor structures $1010A_1$ to $1010A_4$ may be configured to carry a first supply voltage (e.g., VDD), while the second conductor structures $1010B_1$ to $1010B_3$ may be configured to carry a second supply voltage (e.g., VSS).

Figure 11:
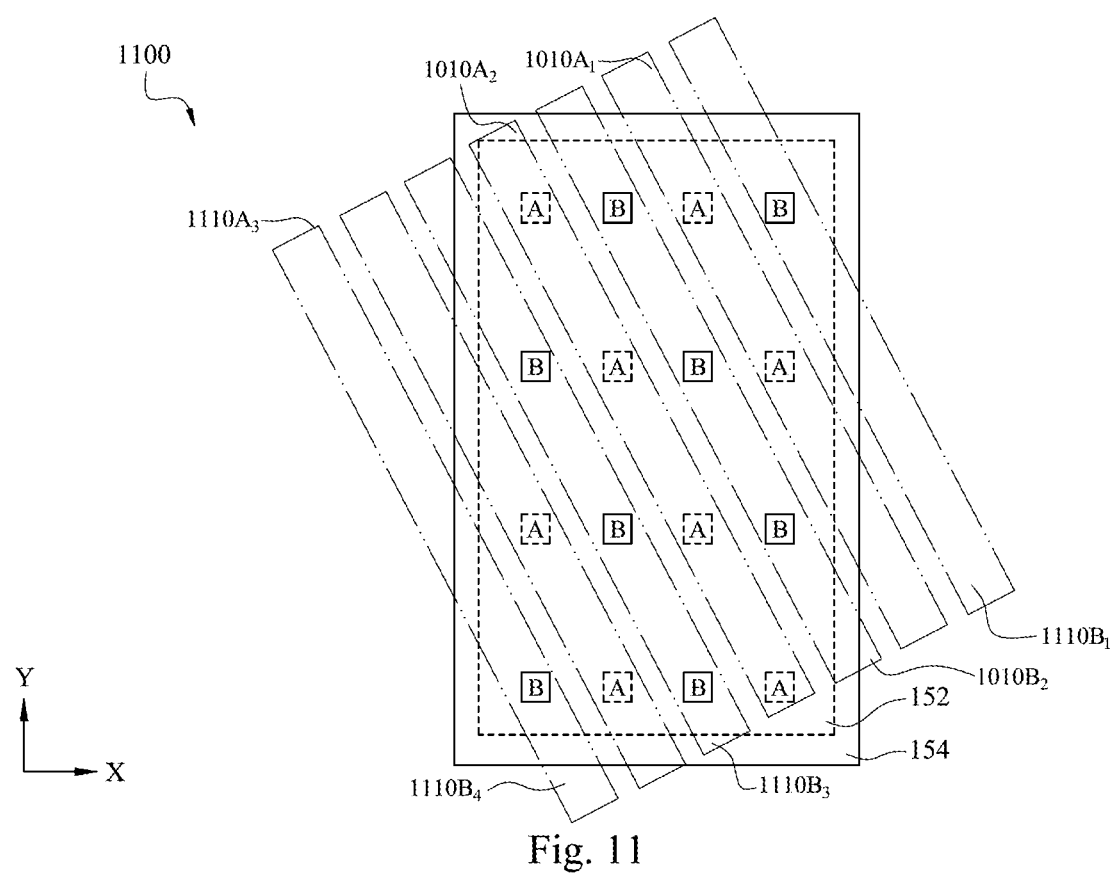

Referring next to FIG. 11, the layout 1100 includes first conductor structures $1110A_1$, $1110A_2$, and $1110A_3$, connected to the contact structures with first polarity (A) formed based on the layout 400, and second conductor structures $1110B_1$, $1110B_2$, $1110B_3$, and $1110B_4$ connected to the contact structures with second polarity (B) formed based on the layout 400. Specifically, each of the first conductor structures $1110A_1$ to $1110A_3$ extends along a direction tilted from the X or Y direction with an angle (e.g., about 75 or 105 degrees) to contact one or more of the contact structures with first polarity (A), and each of the second conductor structures $1110B_1$ to $1110B_4$ extends along the same direction tilted from the X or Y direction with the same angle (e.g., about 75 or 105 degrees) to contact one or more of the contact structures with second polarity (B). As such, the first and second conductor structures, $1110A_1$ to $1110A_3$ and $1110B_1$ to $1110B_4$, may be parallel with one another. In various embodiments, the first conductor structures $1110A_1$ to $1110A_3$ and the second conductor structures $1110B_1$ to $1110B_4$ may be disposed in different metallization layers, respectively, or in the same metallization layer. In some embodiments, the first conductor structures $1110A_1$ to $1110A_3$ may be configured to carry a first supply voltage (e.g., VDD), while the second conductor structures $1110B_1$ to $1110B_4$ may be configured to carry a second supply voltage (e.g., VSS).

Figure 12:
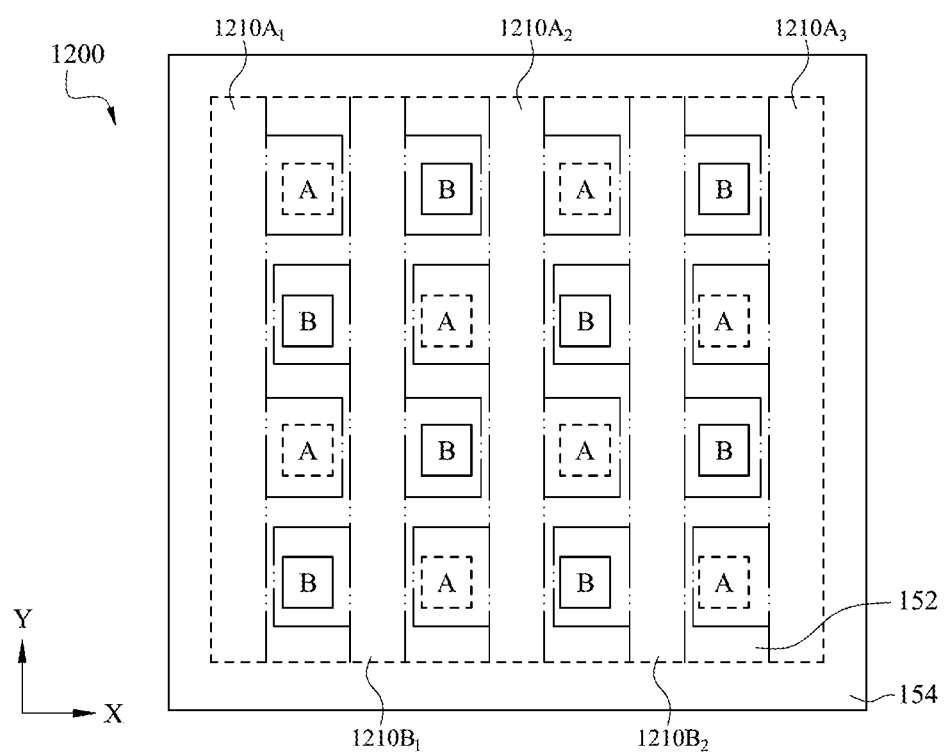

Referring next to FIG. 12, the layout 1200 includes first conductor structures $1210A_1$, $1210A_2$, and $1210A_3$ connected to the contact structures with first polarity (A) formed based on the layout 300, and second conductor structures $1210B_1$ and $1210B_2$ connected to the contact structures with second polarity (B) formed based on the layout 300. Specifically, each of the first conductor structures $1210A_1$ to $1210A_3$ has a first portion extending along the Y direction and a number of second portions protruding away from the first portion along the X direction, and each of the second conductor structures $1210B_1$ to $1210B_2$ has a first portion extending along the Y direction and a number of second portions protruding away from the first portion along the X direction. Such conductor structures may sometimes be referred to as having a tree profile, with the first portion acting as a trunk and the second portions acting as side branches. It should be noted that, except for the conductor structures on the edge, each of the conductor structures may have at least one of its second portions extending away from at least another second portion. In various embodiments, the first conductor structures $1210A_1$ to $1210A_3$ and the second conductor structures $1210B_1$ and $1210B_2$ may be disposed in different metallization layers, respectively, or in the same metallization layer. In some embodiments, the first conductor structures $1210A_1$ to $1210A_3$ may be configured to carry a first supply voltage (e.g., VDD), while the second conductor structures $1210B_1$ to $1210B_2$ may be configured to carry a second supply voltage (e.g., VSS).

Figure 13:
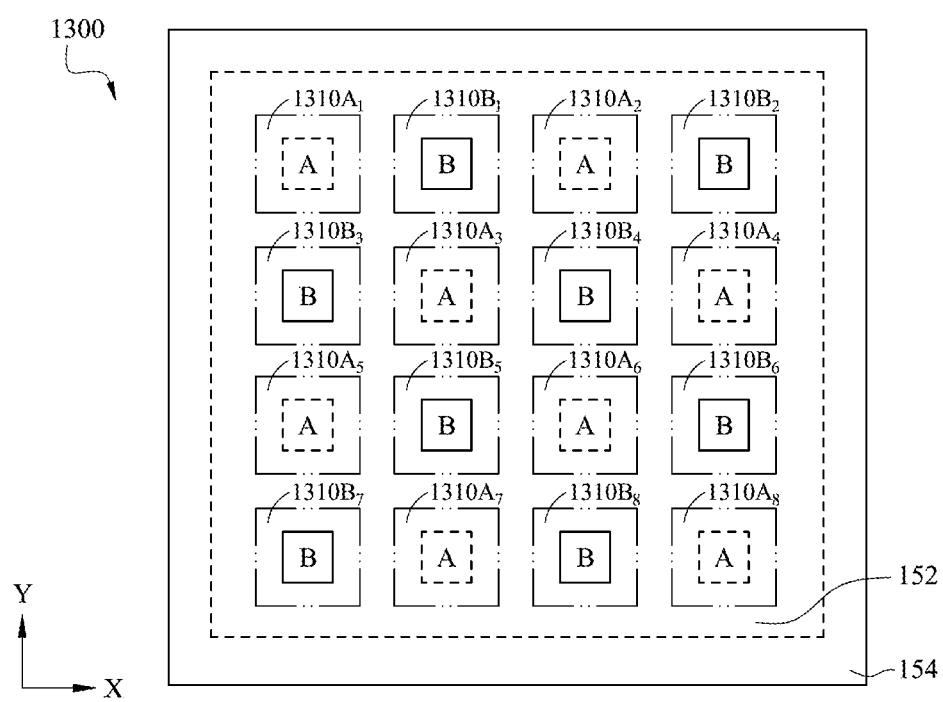

Referring next to FIG. 13, the layout 1300 includes first conductor structures $1310A_1$, $1310A_2$, $1310A_3$, $1310A_4$, $1310A_5$, $1310A_6$, $1310A_7$, and $1310A_8$ connected to the contact structures with first polarity (A) formed based on the layout 300, and second conductor structures $1310B_1$, $1310B_2$, $1310B_3$, $1310B_4$, $1310B_5$, $1310B_6$, $1310B_7$, and $1310B_8$ connected to the contact structures with second polarity (B) formed based on the layout 300. Specifically, each of the first conductor structures $1310A_1$ to $1310A_8$ and the second conductor structures $1310B_1$ to $1310B_8$ is formed as an island to contact corresponding one or more of the first and second contact structures. With the conductor structures each formed as an island, the corresponding MIM capacitor can be freely inserted into the empty area of an IC layout, which will later be discussed. In various embodiments, the first conductor structures $1310A_1$ to $1310A_8$ and the second conductor structures $1310B_1$ and $1310B_8$ may be disposed in different metallization layers, respectively, or in the same metallization layer. In some embodiments, the first conductor structures $1310A_1$ to $1310A_8$ may be configured to carry a first supply voltage (e.g., VDD), while the second conductor structures $1310B_1$ to $1310B_8$ may be configured to carry a second supply voltage (e.g., VSS). Further, when the first conductor structures $1310A_1$ to $1310A_8$ and the second conductor structures $1310B_1$ to $1310B_8$ are all formed in the same metallization layer, each of the contact structures (A and B) can be connected to another island conductor structure disposed in a different (e.g., lower or upper) metallization layer that may be floating.

Figure 14:
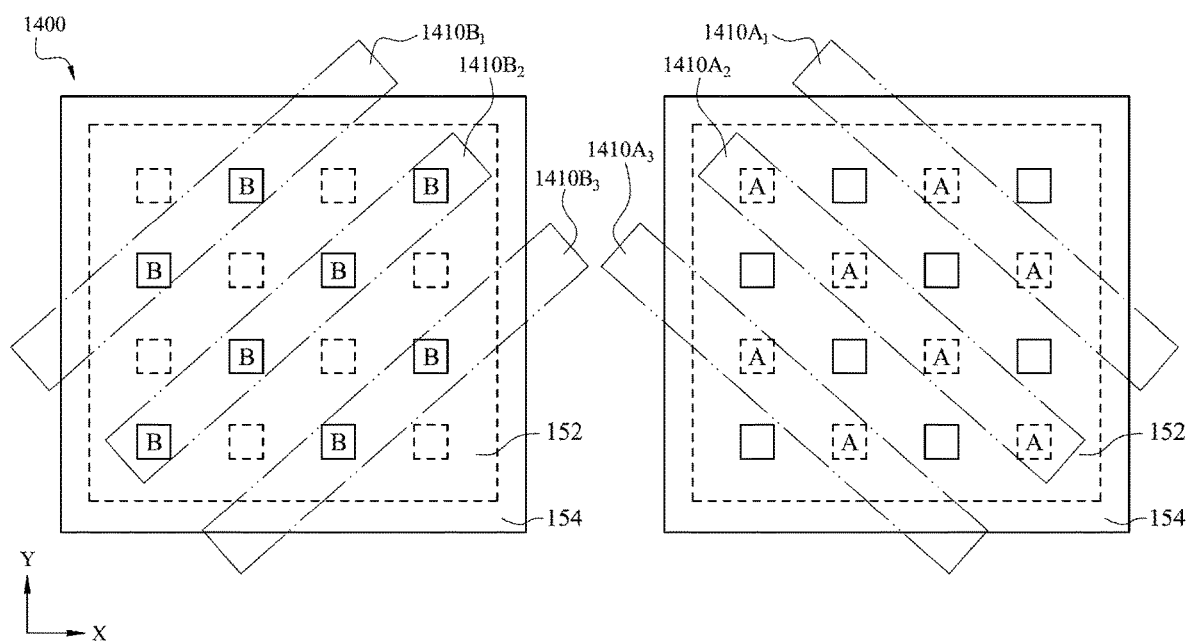

Referring next to FIG. 14, the layout 1400 includes first conductor structures $1410A_1$, $1410A_2$, and $1410A_3$, connected to the contact structures with first polarity (A) formed based on the layout 300, and second conductor structures $1410B_1$, $1410B_2$, and $1410B_3$ connected to the contact structures with second polarity (B) formed based on the layout 300. Specifically, each of the first conductor structures $1410A_1$ to $1410A_3$ extends along a first direction tilted from the X or Y direction with a first angle (e.g., about 45 or 135 degrees) to contact one or more of the contact structures with first polarity (A), and each of the second conductor structures $1410B_1$ to $1410B_3$ extends along a second direction tilted from the X or Y direction with a second angle (e.g., about 135 or 45 degrees) to contact one or more of the contact structures with second polarity (B). The first angle and second angle may collectively form a supplementary angle. In various embodiments, the first conductor structures $1410A_1$ to $1410A_3$ and the second conductor structures $1410B_1$ to $1410B_3$ may be disposed in different metallization layers, respectively. In some embodiments, the first conductor structures $1410A_1$ to $1410A_3$ may be configured to carry a first supply voltage (e.g., VDD), while the second conductor structures $1410B_1$ to $1410B_3$ may be configured to carry a second supply voltage (e.g., VSS).

Figure 15:
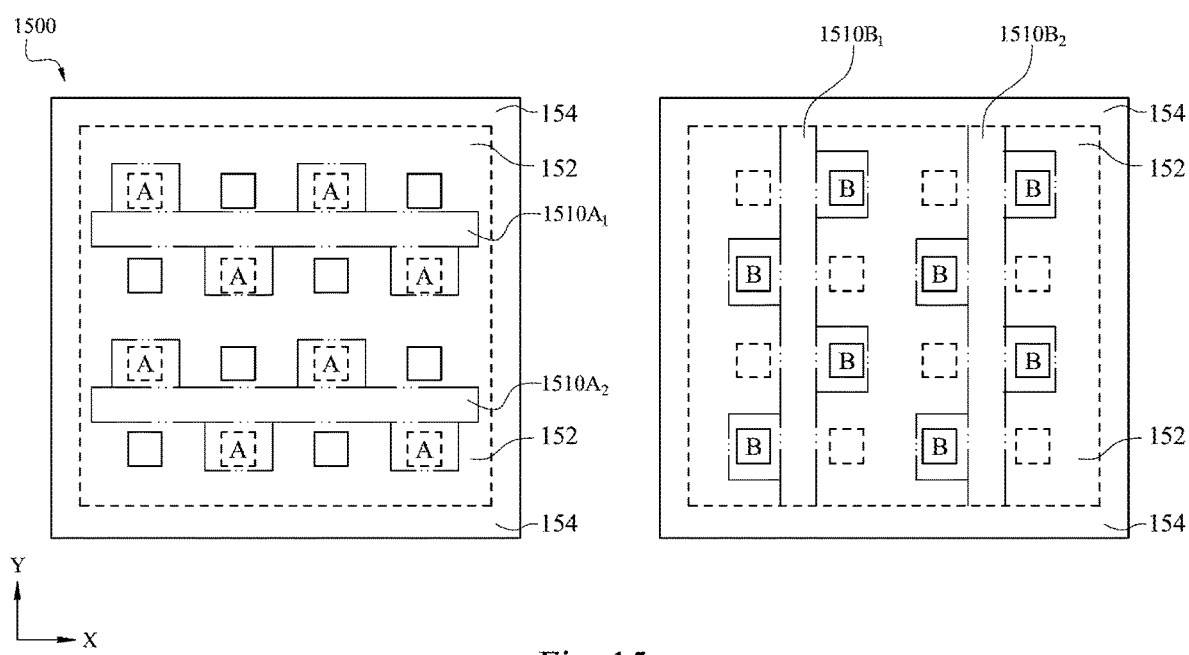

Referring next to FIG. 15, the layout 1500 includes first conductor structures $1510A_1$ and $1510A_2$, connected to the contact structures with first polarity (A) formed based on the layout 300, and second conductor structures $1510B_1$ and $1510B_2$ connected to the contact structures with second polarity (B) formed based on the layout 300. Specifically, each of the first conductor structures $1510A_1$ and $1510A_2$ has a first portion extending along the X direction and a number of second portions protruding away from the first portion along the Y direction, and each of the second conductor structures $1510B_1$ and $1510B_2$ has a first portion extending along the Y direction and a number of second portions protruding away from the first portion along the X direction. Such conductor structures may sometimes be referred to as having a tree profile, with the first portion acting as a trunk and the second portions acting as side branches. In various embodiments, the first conductor structures $1510A_1$ and $1510A_2$ and the second conductor structures $1510B_1$ and $1510B_2$ may be disposed in different metallization layers, respectively. In some embodiments, the first conductor structures $1510A_1$ and $1510A_2$ may be configured to carry a first supply voltage (e.g., VDD), while the second conductor structures $1510B_1$ and $1510B_2$ may be configured to carry a second supply voltage (e.g., VSS).

Figure 16:
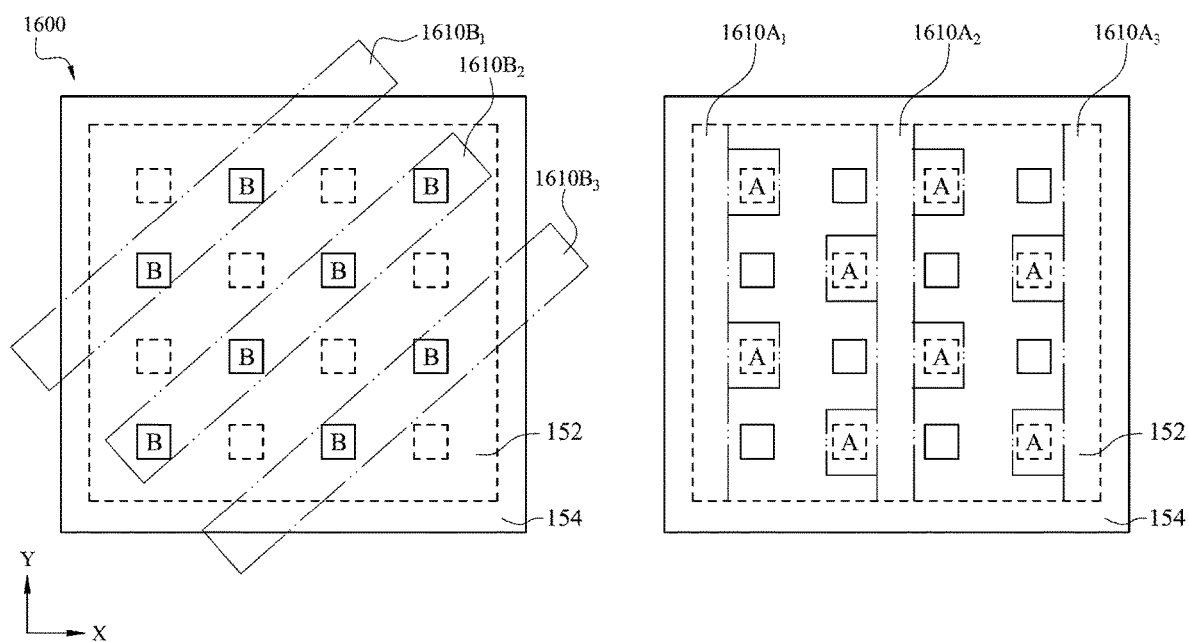

Referring next to FIG. 16, the layout 1600 includes first conductor structures $1610A_1$, $1610A_2$, and $1610A_3$, connected to the contact structures with first polarity (A) formed based on the layout 300, and second conductor structures $1610B_1$, $1610B_2$, and $1610B_3$ connected to the contact structures with second polarity (B) formed based on the layout 300. Specifically, each of the second conductor structures $1610A_1$ to $1610A_3$ has a first portion extending along the Y direction and a number of second portions protruding away from the first portion along the X direction, and each of the second conductor structures $1610B_1$ to $1610B_3$ extends along a direction tilted from the X or Y direction with an angle (e.g., about 135 or 45 degrees) to contact one or more of the contact structures with second polarity (B). In various embodiments, the first conductor structures $1610A_1$ to $1610A_3$ and the second conductor structures $1610B_1$ to $1610B_3$ may be disposed in different metallization layers, respectively. In some embodiments, the first conductor structures $1610A_1$ to $1610A_3$ may be configured to carry a first supply voltage (e.g., VDD), while the second conductor structures $1610B_1$ to $1610B_3$ may be configured to carry a second supply voltage (e.g., VSS).

Figure 17:
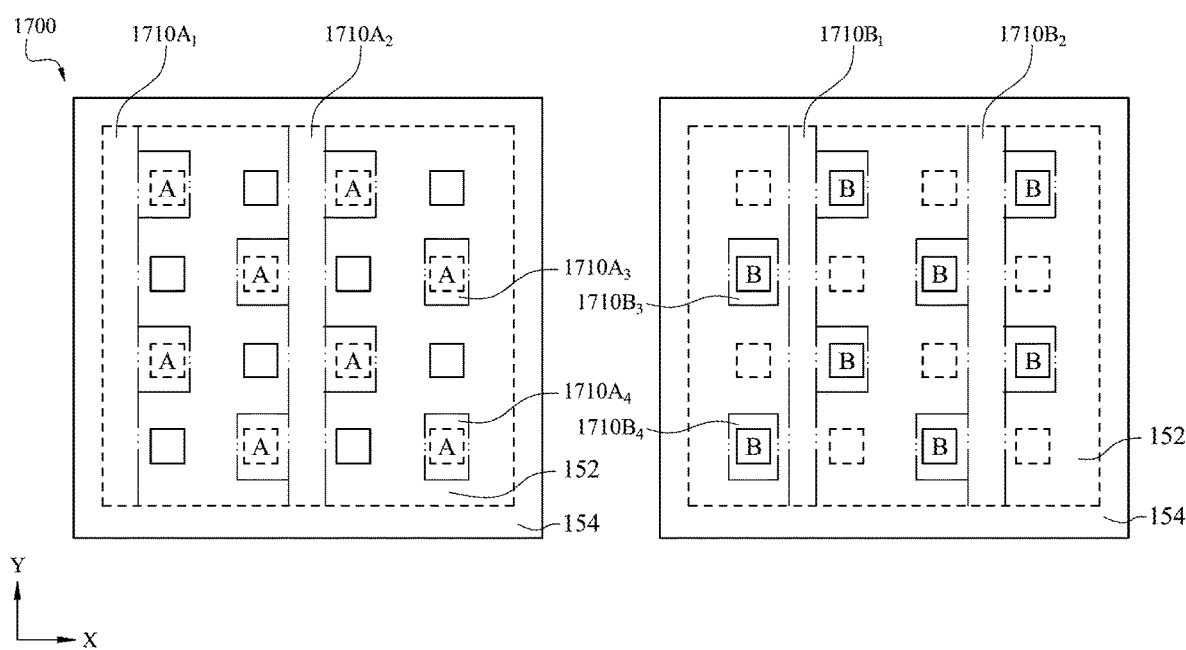

Referring next to FIG. 17, the layout 1700 includes first conductor structures $1710A_1$, $1710A_2$, $1710A_3$, and $1710A_4$, connected to the contact structures with first polarity (A) formed based on the layout 300, and second conductor structures $1710B_1$, $1710B_2$, $1710B_3$, and $1710B_4$ connected to the contact structures with second polarity (B) formed based on the layout 300. Specifically, each of the first conductor structures $1710A_1$ to $1710A_2$ has a first portion extending along the Y direction and a number of second portions protruding away from the first portion along the X direction, while each of the first conductor structures $1710A_3$ to $1710A_4$ is formed as an island. Similarly, each of the second conductor structures $1710B_1$ to $1710B_2$ has a first portion extending along the Y direction and a number of second portions protruding away from the first portion along the X direction, while each of the second conductor structures $1710B_3$ to $1710B_4$ is formed as an island. In various embodiments, the first conductor structures $1710A_1$ to $1710A_4$ and the second conductor structures $1710B_1$ to $1710B_4$ may be disposed in different metallization layers, respectively. In some embodiments, the first conductor structures $1710A_1$ to $1710A_2$ may be configured to carry a first supply voltage (e.g., VDD) with the first conductor structures $1710A_3$ to $1710A_4$ being floating, while the second conductor structures $1710B_1$ to $1710B_2$ may be configured to carry a second supply voltage (e.g., VSS) with the second conductor structures $1710B_3$ to $1710B_4$ being floating.

Figure 18:
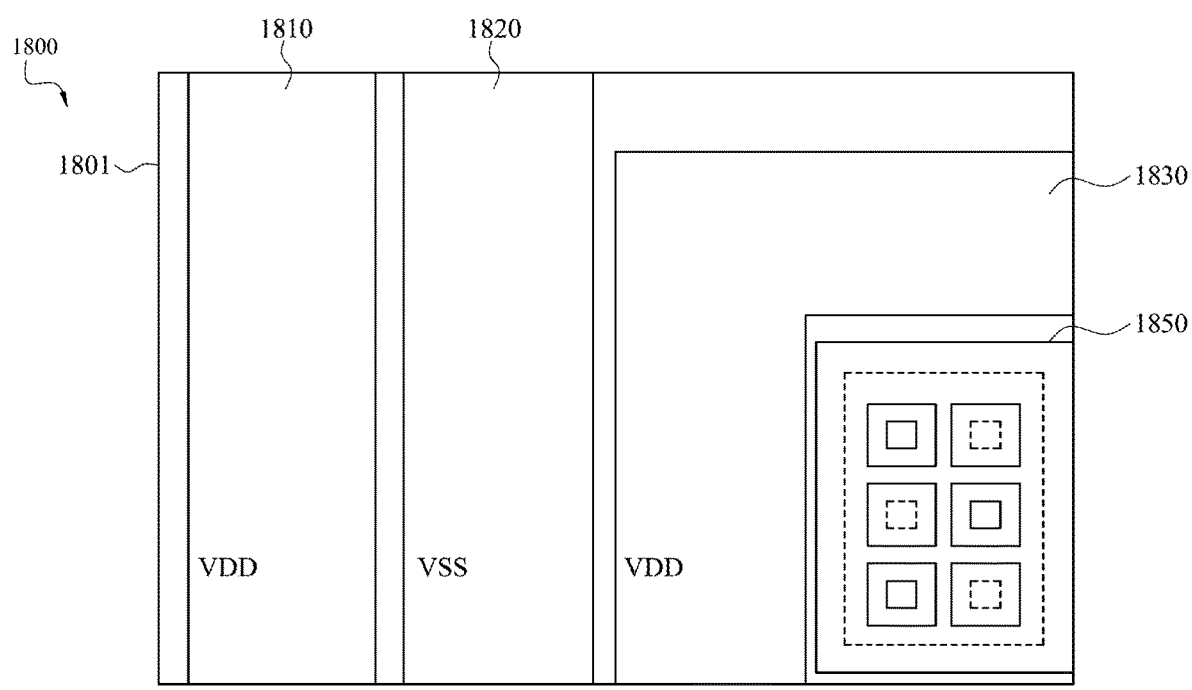
FIGS. 18 and 19 each illustrate an example IC layout with the disclosed MIM capacitor inserted, in accordance with some embodiments.
Figure 19:
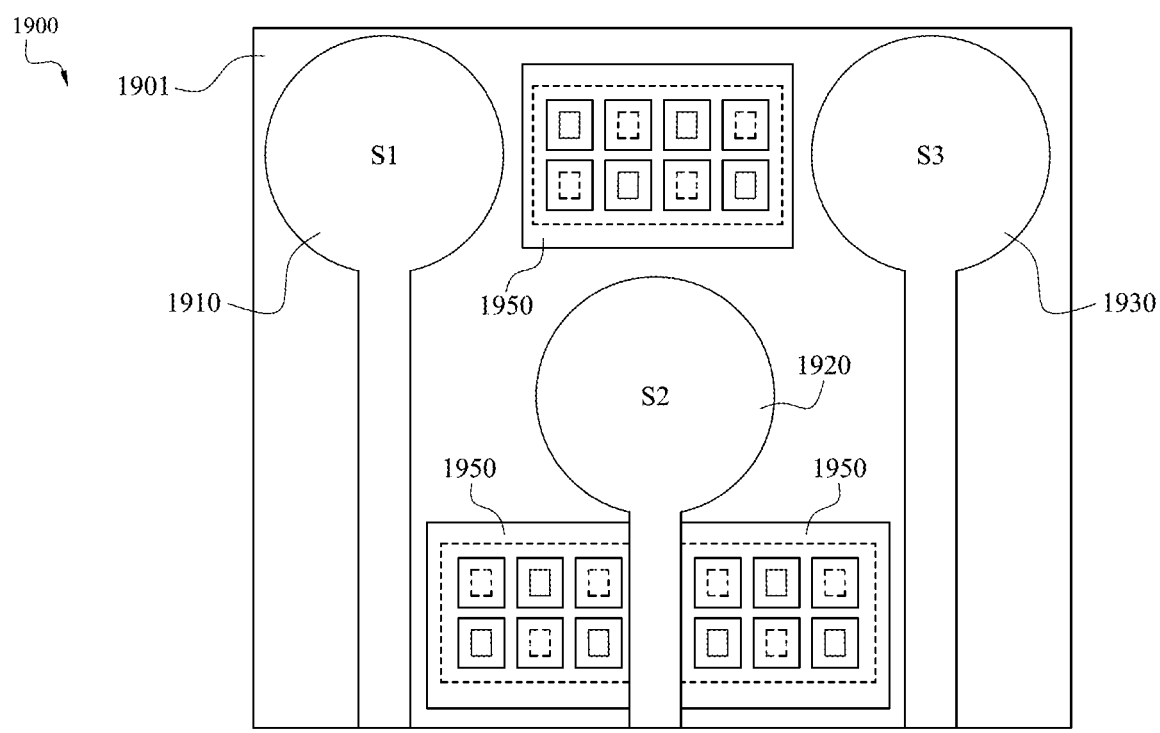

With the conductor structures each formed as an island (e.g., layout 1300), the MIM capacitor 150 can be freely or flexibly inserted to the empty area of an IC layout. FIGS. 18 and 19 illustrate example IC layouts 1800 and 1900, respectively, having an example layout of the MIM capacitor 150 inserted, in accordance with various embodiments. The example layout of the MIM capacitor 150 in FIGS. 18 and 19 includes a number of island conductor structures each connected to a corresponding one of its contact structures.

For example in FIG. 18, the layout 1800 includes a floorplan 1801 enclosing conductor structures 1810, 1820, and 1830, in which the conductor structures 1810 and 1830 are configured as first power rails to carry a first supply voltage (e.g., VDD) and the conductor structure 1820 is configured as a second power rail to carry a second supply voltage (e.g., VSS). In some embodiments, an example layout 1850 of the MIM capacitor, in which the corresponding conductor structures are each formed as an island, can be inserted into an empty area of the floorplan 1801. In another example in FIG. 19, the layout 1900 includes a floorplan 1901 enclosing conductor structures 1910, 1920, and 1930, in which the conductor structures 1910, 1920, and 1930 are configured as signal routings to carry respectively different signals, S1, S2, and S3. In some embodiments, a number of example layouts 1950 of the MIM capacitor, in which the corresponding conductor structures are each formed as an island, can be inserted into respective empty areas of the floorplan 1901.

Figure 20:
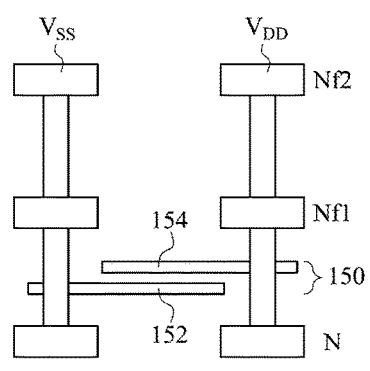
FIGS. 20, 21, and 22 each illustrate a cross-sectional view of a portion of a semiconductor device including the MIM capacitor of FIG. 1, in accordance with some embodiments.
Figure 21:
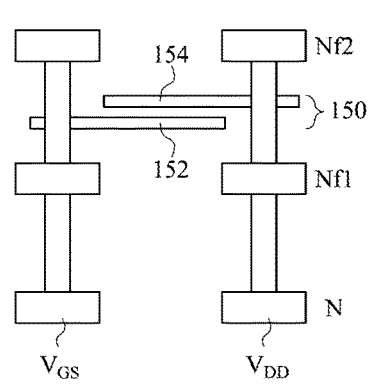
Figure 22:
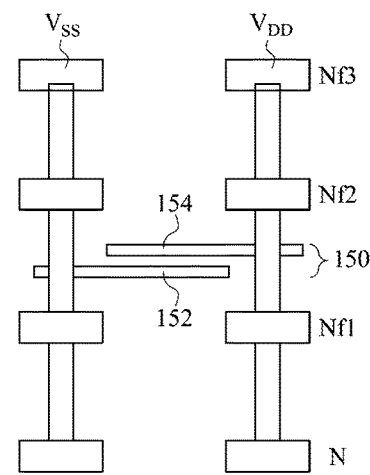

Further, with the conductor structures for the MIM capacitor 150 each formed as an island (e.g., layout 1300), the conductor structures can be formed across multiple (e.g., more than two) metallization layers. FIGS. 20, 21, and 22 respectively illustrate various example cross-sectional views of the MIM capacitor 150 having its connected conductor structures formed across multiple metallization layers, in accordance with various embodiments.

For example in FIG. 20, the MIM capacitor 150 (with its top and bottom conductor plates 152 and 154) is disposed between metallization layers "N" and "N+1." Further, a metallization layer "N+2" disposed above the N+1 layer includes island conductor structures configured to carry VDD and VSS, respectively. In another example in FIG. 21, the MIM capacitor 150 (with its top and bottom conductor plates 152 and 154) is disposed between metallization layers "N+1" and "N+2." Further, a metallization layer "N" disposed below the N+1 layer includes island conductor structures configured to carry VDD and VSS, respectively. In yet another example in FIG. 22, the MIM capacitor 150 (with its top and bottom conductor plates 152 and 154) is disposed between metallization layers "N+1" and "N+2." Further, a metallization layer "N+3" disposed above the N+2 layer includes island conductor structures configured to carry VDD and VSS, respectively, or a metallization layer "N" disposed below the N+1 layer includes island conductor structures configured to carry VDD and VSS, respectively.

Figure 23:
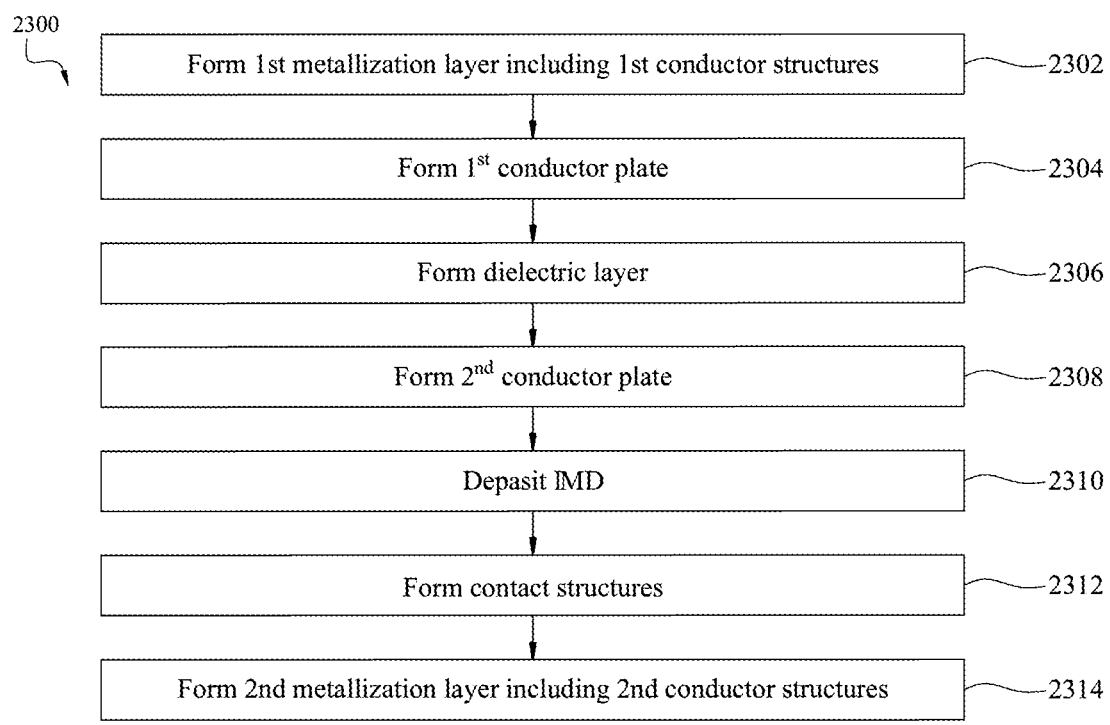
FIG. 23 illustrate a flow chart of an example method for fabricating a semiconductor device, in accordance with some embodiments.

FIG. 23 illustrates a flow chart of an example method 2300 for forming an MIM capacitor with the disclosed contact structures and conductor structures, in accordance with some embodiments. It should be noted that the method 2300 is merely an example, and is not intended to limit the present disclosure. Accordingly, it is understood that the order of operation of the method 2300 of FIG. 23 can change, that additional operations may be provided before, during, and after the method 2300 of FIG. 23, and that some other operations may only be described briefly herein. Such an MIM capacitor, made by the method 2300, may include one or more components, as discussed above with respect to FIGS. 1-22. Accordingly, operations of the method 2300 will be discussed in conjunction with FIGS. 1-22, as illustrative examples.

The method 2300 starts with operation 2302 of forming a first metallization layer including a number of first conductor structures. In some embodiments, the first metallization layer may be one of many metallization layers (sometimes collectively referred to as part of back-end-of-line (BEOL) processing) formed above a number of device structures (sometimes collectively referred to as part of front-end-of-line (FEOL) processing). Each of these BEOL metallization layers has a number of conductor structures formed as metal lines or traces. The conductor structures are formed of a conductive material, usually copper. Using FIG. 1 as a representative example, the first metallization layer may be the M4 layer having the conductor structures 120A, 120B, etc.

The method 2300 continues to operation 2304 of forming a first conductor plate. In some embodiments, the first conductor plate is formed above the first metallization layer. Continuing with the above example, the first conductor plate (e.g., 152) is disposed above the M4 layer. The first conductor plate 152 may function as the bottom electrode (or bottom conductor plate) of an MIM capacitor. Further, the first conductor plate 152 can be formed by first depositing a first blanket metal material (e.g., Pt, AlCu, TiN, Au, Ti, Ta, TaN, W, WN, Cu, metal nitrides, silicided metal nitrides, or combinations thereof) over the first metallization layer, followed by a patterning process which can also define a dielectric medium and/or a top electrode of the MIM capacitor.

The method 2300 continues to operation 2306 of forming a dielectric layer. In some embodiments, the dielectric layer is formed above the bottom electrode (e.g., the first conductor plate), which functions as a dielectric medium of the MIM capacitor. For example, the dielectric layer (e.g., 156) can be formed by first depositing a blanket dielectric material (e.g., NiO, TiO, HfO, ZrO, ZnO, $WO_3$, $Al_2O_3$, TaO, MoO, CuO, $TiO_2$, $Ta_2O_5$, $Y_2O_3$, $La_2O_5$, $HfO_2$, or combinations thereof) over the first blanket metal material, followed by the same patterning process. In some other embodiments, the dielectric layer may be formed by a respective (different) patterning process, following the formation of the bottom electrode (e.g., the first conductor plate).

The method 2300 continues to operation 2308 of forming a second conductor plate. In some embodiments, the second conductor plate is formed above the dielectric layer. Continuing with the above example, the second conductor plate (e.g., 154) may function as the top electrode (or top conductor plate) of an MIM capacitor. Further, the second conductor plate 154 can be formed by first depositing a second blanket metal material (e.g., Pt, AlCu, TiN, Au, Ti, Ta, TaN, W, WN, Cu, metal nitrides, silicided metal nitrides, or combinations thereof) over the blanket dielectric material, followed by the same patterning process. In some other embodiments, the top electrode (e.g., the second conductor plate) may be formed by a respective (different) patterning process, following the formation of the dielectric layer.

The method 2300 continues to operation 2310 of depositing an inter-metal dielectric( IMD) material. In some embodiments, the IMD material may be deposited to overlay the first conductor plate, the dielectric layer, and the second conductor plate (of the MIM capacitor). The IMD material can include one of the following materials: silicon oxide, a low dielectric constant (low-k) material, other suitable dielectric material, or a combination thereof. The low-k dielectric material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

The method 2300 continues to operation 2312 of forming a number of contact structures. In some embodiments, a first group of the contact structures are formed to contact the first conductor plate, and a second group of the contact structures are formed to contact the second conductor plate. When the first conductor plate is electrically connected to a first supply voltage and the second conductor plate is electrically connected to a second supply voltage (in which the MIM capacitor functions as a decoupling capacitor), the first group of contact structures and the second group of contact structures may be referred to as having different polarities. Further, when viewed from the top, the contact structures are arranged with one another in a checkboard pattern, which can be formed based on the above-discussed layouts (e.g., 300, 400, 500). For example, each of the first group of contact structures (except for the ones disposed along the edge) is separated from four neighboring ones of the first group of contact structures with corresponding four ones of the second group of contact structures. In some embodiments, the contact structures formed of a conductive material, usually copper, may be formed together with a number of second conductor structures in a second metallization layer above the first metallization layer.

The method 2300 continues to operation 2314 of forming a second metallization layer including a number of second conductor structures. Continuing with the above example of FIG. 1, the second metallization layer may be the M5 layer having the conductor structures 120C, 120D, etc. Further, as the contact structures are formed as the checkboard pattern, the first conductor structures in the M4 layer and the second conductor structures in the M5 layer may be formed to follow the profiles of conductor structures shown in the above-discussed layouts (e.g., 600, 700, 800, 900, 1000, 1100, 1200, 1300, 1400, 1500, 1600, 1700).

In one aspect of the present disclosure, a semiconductor device is disclosed. The semiconductor device includes a capacitor having a first conductor plate, a second conductor plate, and a portion of a dielectric layer interposed therebetween. The semiconductor device includes a plurality of first contact structures in electrical contact with the first conductor plate. The semiconductor device includes a plurality of second contact structures in electrical contact with the second conductor plate. The plurality of first contact structures and the plurality of second contact structures are laterally arranged in a checkboard pattern, thereby causing each of the plurality of first contact structures to be surrounded by respective four of the plurality of second contact structures.

In another aspect of the present disclosure, a semiconductor device is disclosed. The semiconductor device includes a plurality of transistors formed along a major surface of a substrate. The semiconductor device includes a plurality of metallization layers disposed over the plurality of transistors. The semiconductor device includes a capacitor disposed between a first one of the plurality of metallization layers and a second one of the plurality of metallization layers, wherein the capacitor has a first conductor plate, a second conductor plate, and a dielectric layer interposed therebetween. The semiconductor device includes a plurality of first contact structures extending from the first metallization layer to the second metallization layer, and in electrical contact with the first conductor plate. The semiconductor device includes a plurality of second contact structures extending from the first metallization layer to the second metallization layer, and in electrical contact with the second conductor plate. The semiconductor device includes a plurality of first conductor structures disposed in the first metallization layer. The semiconductor device includes a plurality of second conductor structures disposed in the second metallization layer. Each of the plurality of first contact structures is separated from a next neighboring one of the plurality of first contact structures with a corresponding one of the plurality of second contact structures along at least one of a first lateral direction or a second lateral direction. The plurality of first contact structures and the plurality of second contact structures are alternately arranged along both the first lateral direction and the second lateral direction.

In yet another aspect of the present disclosure, a method for fabricating semiconductor devices is disclosed. The method includes forming a first metallization layer comprising a plurality of first conductor structures. The method includes forming, over the first metallization layer, a first conductor plate. The method includes forming a second conductor plate over the first conductor plate. The method includes forming a plurality of first contact structures in electrical contact with the first conductor plate. The method includes forming a plurality of second contact structures in electrical contact with the second conductor plate, wherein each of the plurality of first contact structures is separated from four neighboring ones of the plurality of first contact structures with corresponding four ones of the plurality of second contact structures. The method includes forming, over the first metallization layer, a second metallization layer comprising a plurality of second conductor structures.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a capacitor having a first conductor plate, a second conductor plate, and a portion of a dielectric layer interposed therebetween;
    a plurality of first contact structures in electrical contact with the first conductor plate, wherein the plurality of first contact structures have a first polarity; and
    a plurality of second contact structures in electrical contact with the second conductor plate, wherein the plurality of second contact structures have a second polarity opposite the first polarity;
    wherein the plurality of first contact structures and the plurality of second contact structures are laterally arranged in a checkboard pattern, thereby causing each of the plurality of first contact structures to be surrounded by respective four of the plurality of second contact structures of an opposite polarity.

2. The semiconductor device of claim 1, wherein two of the four second contact structures are spaced from the corresponding first contact structure with a first distance along a first lateral direction, and other two of the four second contact structures are spaced from the corresponding first contact structure with the first distance along a second lateral direction perpendicular to the first lateral direction.

3. The semiconductor device of claim 2, wherein each of the plurality of first contact structures is spaced from an immediately neighboring one of the plurality of first contact structures with a second distance that is substantially greater than the first distance.

4. The semiconductor device of claim 3, wherein the second distance is equal to a square root of two times the first distance.

5. The semiconductor device of claim 1, further comprising:
    a plurality of first conductor structures electrically connected to the first conductor plate through the plurality of first contact structures; and
    a plurality of second conductor structures electrically connected to the second conductor plate through the plurality of second contact structures.

6. The semiconductor device of claim 5, wherein the first conductor plate and second conductor plate are interposed between the plurality of first conductor structures and the plurality of second conductor structures.

7. The semiconductor device of claim 5, wherein the plurality of first conductor structures are disposed in a first metallization layer and the plurality of second conductor structures are disposed in a second metallization layer disposed above the first metallization layer, and wherein the dielectric layer is interposed between the first and second metallization layers.

8. The semiconductor device of claim 5, wherein at least one of the plurality of first conductor structures is connected to a first supply voltage, and at least one of the plurality of second conductor structures is connected to a second supply voltage.

9. The semiconductor device of claim 5, wherein the plurality of first conductor structures and the plurality of second conductor structures each extend along a first lateral direction tilted from a second lateral direction or a third lateral direction, and wherein the plurality of first contact structures and the plurality of second contact structures are alternately arranged along the second or third lateral direction.

10. The semiconductor device of claim 5, wherein the plurality of first conductor structures each extend along a first lateral direction and the plurality of second conductor structures each extend along a second lateral direction, wherein the first lateral direction is tilted from a third lateral direction or a fourth lateral direction with a first angle and the second lateral direction is tilted from the third lateral direction or the fourth lateral direction with a second angle, and wherein the plurality of first contact structures and the plurality of second contact structures are alternately arranged along the third or fourth lateral direction.

11. The semiconductor device of claim 10, wherein the first angle and the second angle are supplementary angles.

12. The semiconductor device of claim 5, wherein the plurality of first conductor structures each have a first portion extending along a first lateral direction and a plurality of second portions protruding from its first portion along a second lateral direction perpendicular to the first lateral direction, wherein the plurality of second conductor structures each have a first portion extending along the first lateral direction and a plurality of second portions protruding from its first portion along the second lateral direction, and wherein the plurality of first contact structures and the plurality of second contact structures are alternately arranged along the first or second lateral direction.

13. A semiconductor device, comprising:
 a capacitor having a first conductor plate, a second conductor plate, and a portion of a dielectric layer interposed therebetween;
 a plurality of first contact structures in electrical contact with the first conductor plate, wherein the plurality of first contact structures have a first polarity; and
 a plurality of second contact structures in electrical contact with the second conductor plate, wherein the plurality of second contact structures have a second polarity opposite the first polarity;
 wherein the plurality of first contact structures and the plurality of second contact structures are laterally arranged in a checkboard pattern.

14. The semiconductor device of claim 13, wherein each of the plurality of first contact structures is surrounded by respective four of the plurality of second contact structures.

15. The semiconductor device of claim 13, further comprising:
 a plurality of first conductor structures electrically connected to the first conductor plate through the plurality of first contact structures; and
 a plurality of second conductor structures electrically connected to the second conductor plate through the plurality of second contact structures.

16. The semiconductor device of claim 15, wherein the first conductor plate and second conductor plate are interposed between the plurality of first conductor structures and the plurality of second conductor structures.

17. The semiconductor device of claim 15, wherein the plurality of first conductor structures are disposed in a first metallization layer and the plurality of second conductor structures are disposed in a second metallization layer disposed above the first metallization layer, and wherein the dielectric layer is interposed between the first and second metallization layers.

18. The semiconductor device of claim 15, wherein at least one of the plurality of first conductor structures is connected to a first supply voltage, and at least one of the plurality of second conductor structures is connected to a second supply voltage.

19. A semiconductor device, comprising:
 a capacitor having a first conductor plate, a second conductor plate, and a portion of a dielectric layer interposed therebetween;
 a plurality of first contact structures in electrical contact with the first conductor plate; and
 a plurality of second contact structures in electrical contact with the second conductor plate;
 wherein the plurality of first contact structures and the plurality of second contact structures are laterally arranged in a checkboard pattern, thereby causing each of the plurality of first contact structures to be surrounded by respective four of the plurality of second contact structures; and
 wherein two of the four second contact structures are spaced from the corresponding first contact structure with a first distance along a first lateral direction, and other two of the four second contact structures are spaced from the corresponding first contact structure with the first distance along a second lateral direction perpendicular to the first lateral direction;
 wherein each of the plurality of first contact structures is spaced from an immediately neighboring one of the plurality of first contact structures with a second distance that is substantially greater than the first distance.

20. The semiconductor device of claim 19, wherein the second distance is equal to a square root of two times the first distance.

* * * * *